United States Patent
Ikarashi et al.

(10) Patent No.: US 7,969,693 B2
(45) Date of Patent: Jun. 28, 2011

(54) TUNNEL MAGNETORESISTIVE SENSOR IN WHICH AT LEAST PART OF PINNED LAYER IS COMPOSED OF COFEB LAYER AND METHOD FOR MANUFACTURING THE TUNNEL MAGNETORESISTIVE SENSOR

(75) Inventors: Kazuaki Ikarashi, Niigata-ken (JP); Eiji Umetsu, Niigata-ken (JP); Kenichi Tanaka, Niigata-ken (JP); Kazumasa Nishimura, Niigata-ken (JP); Masamichi Saito, Niigata-ken (JP); Yosuke Ide, Niigata-ken (JP); Ryo Nakabayashi, Niigata-ken (JP); Yoshihiro Nishiyama, Niigata-ken (JP); Hidekazu Kobayashi, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 951 days.

(21) Appl. No.: 11/857,921

(22) Filed: Sep. 19, 2007

(65) Prior Publication Data
US 2008/0074805 A1  Mar. 27, 2008

(30) Foreign Application Priority Data

Sep. 21, 2006 (JP) ................................. 2006-255646
Mar. 14, 2007 (JP) ................................. 2007-065628

(51) Int. Cl.
*G11B 5/39* (2006.01)

(52) U.S. Cl. .................................................... 360/324.2
(58) Field of Classification Search .................. None
See application file for complete search history.

(56) References Cited

U.S. PATENT DOCUMENTS

| 7,672,088 B2 * | 3/2010 | Zhang et al. .............. 360/324.11 |
| 7,751,156 B2 * | 7/2010 | Mauri et al. ................ 360/324.2 |
| 7,760,474 B1 * | 7/2010 | Huai et al. ................ 360/324.12 |
| 7,764,468 B2 * | 7/2010 | Sawada et al. ................ 360/313 |
| 7,800,868 B2 * | 9/2010 | Gao et al. .................. 360/324.12 |
| 7,821,747 B2 * | 10/2010 | Gill ............................. 360/324.2 |

FOREIGN PATENT DOCUMENTS

| JP | 2005-197764 | 7/2005 |
| JP | 2004-179667 | 6/2007 |

* cited by examiner

*Primary Examiner* — Mark Blouin
(74) *Attorney, Agent, or Firm* — Brinks Hofer Gilson & Lione (57) ABSTRACT

A tunnel magnetoresistive sensor includes a pinned magnetic layer, an insulating barrier layer formed of Mg—O, and a free magnetic layer. A barrier-layer-side magnetic sublayer constituting at least part of the pinned magnetic layer and being in contact with the insulating barrier layer includes a first magnetic region formed of CoFeB or FeB and a second magnetic region formed of CoFe or Fe. The second magnetic region is disposed between the first magnetic region and the insulating barrier layer.

20 Claims, 9 Drawing Sheets

▲ EXAMPLES 7-13
○ COMPARATIVE EXAMPLE 1

FIG. 11

▲ EXAMPLES 7-13
○ COMPARATIVE EXAMPLE 1

FIG. 12

TUNNEL MAGNETORESISTIVE SENSOR IN WHICH AT LEAST PART OF PINNED LAYER IS COMPOSED OF COFEB LAYER AND METHOD FOR MANUFACTURING THE TUNNEL MAGNETORESISTIVE SENSOR

CLAIM OF PRIORITY

This application claims benefit of the Japanese Patent Application No. 2006-255646 filed on Sep. 21, 2006 and No. 2007-065628 filed on Mar. 14, 2007, which are hereby incorporated by reference

BACKGROUND

1. Field of the Invention

The present invention relates to a tunnel magnetoresistive sensor that may be installed in a hard disk drive or be used as a magnetoresistive random access memory (MRAM), and more specifically, it relates to a tunnel magnetoresistive sensor that can achieve a high rate of resistance change ($\Delta R/R$) when Mg—O is used as an insulating barrier layer, and to a method for manufacturing the tunnel magnetoresistive sensor.

2. Description of Related Art

Tunnel magnetoresistive sensors generate a resistance change by utilizing a tunneling effect. When the magnetization of a pinned magnetic layer is antiparallel to the magnetization of a free magnetic layer, less tunneling current flows through an insulating barrier layer (tunnel barrier layer) disposed between the pinned magnetic layer and the free magnetic layer, and thereby the resistance reaches its peak. On the other hand, when the magnetization of the pinned magnetic layer is parallel to the magnetization of the free magnetic layer, the tunneling current reaches the maximum, and the resistance reaches the minimum.

According to this principle, an external magnetic field changes the magnetization of the free magnetic layer and thereby changes the electrical resistance. The tunnel magnetoresistive sensors detect the change in electrical resistance as a voltage change and thereby detect a leakage field from a recording medium.

Important characteristics of the tunnel magnetoresistive sensors include the rate of resistance change ($\Delta R/R$) and RA (resistance R×area A). The material for an insulating barrier layer, the materials for a pinned magnetic layer and a free magnetic layer disposed on both sides of the insulating barrier layer, and the structure of these layers have been improved to optimize these characteristics.

Japanese Unexamined Patent Application Publication No. 2004-179667 and No. 2005-197764 describe tunnel magnetoresistive sensors.

One task of tunnel magnetoresistive sensors is to achieve a high rate of resistance change ($\Delta R/R$) to increase the detectivity and thereby improve the characteristics of a playback head. It is known that optimization of the composition of a free magnetic layer or a pinned magnetic layer and optimization of the crystal structure of an insulating barrier layer or the free magnetic layer, including use of a material having high spin polarizability at an interface with the insulating barrier layer, are important to increase the rate of resistance change ($\Delta R/R$) of a tunnel magnetoresistive sensor.

Since different materials for the insulating barrier layer impart different characteristics including the rate of resistance change ($\Delta R/R$), research must be conducted in a manner that depends on the material of the insulating barrier layer.

For example, in a structure composed of an antiferromagnetic layer, a pinned magnetic layer, an insulating barrier layer, and a free magnetic layer laminated in that order from the bottom, when the pinned magnetic layer has a layered ferri structure composed of a first pinned magnetic sublayer, a nonmagnetic intermediate sublayer, and a second pinned magnetic sublayer laminated in that order from the bottom, and when the insulating barrier layer is formed of Mg—O, the second pinned magnetic sublayer was heretofore formed of CoFeB.

CoFeB that contains a high concentration of B is known to be predominantly amorphous in a non-heat-treated (as deposited) state. Thus, when the second pinned magnetic sublayer is amorphous, the insulating barrier layer and the free magnetic layer formed on the second pinned magnetic sublayer is thought to be less affected by the crystalline orientation under the second pinned magnetic sublayer. This will increase the crystalline orientation and thereby increase the rate of resistance change ($\Delta R/R$).

However, the second pinned magnetic sublayer crystallized incompletely from the amorphous state even when heat treated in a manufacturing process of the tunnel magnetoresistive sensor. Consequently, it turned out that, in the structure described above, the crystalline orientation was improved insufficiently, and the high rate of resistance change ($\Delta R/R$) could not be achieved.

Figure 12:
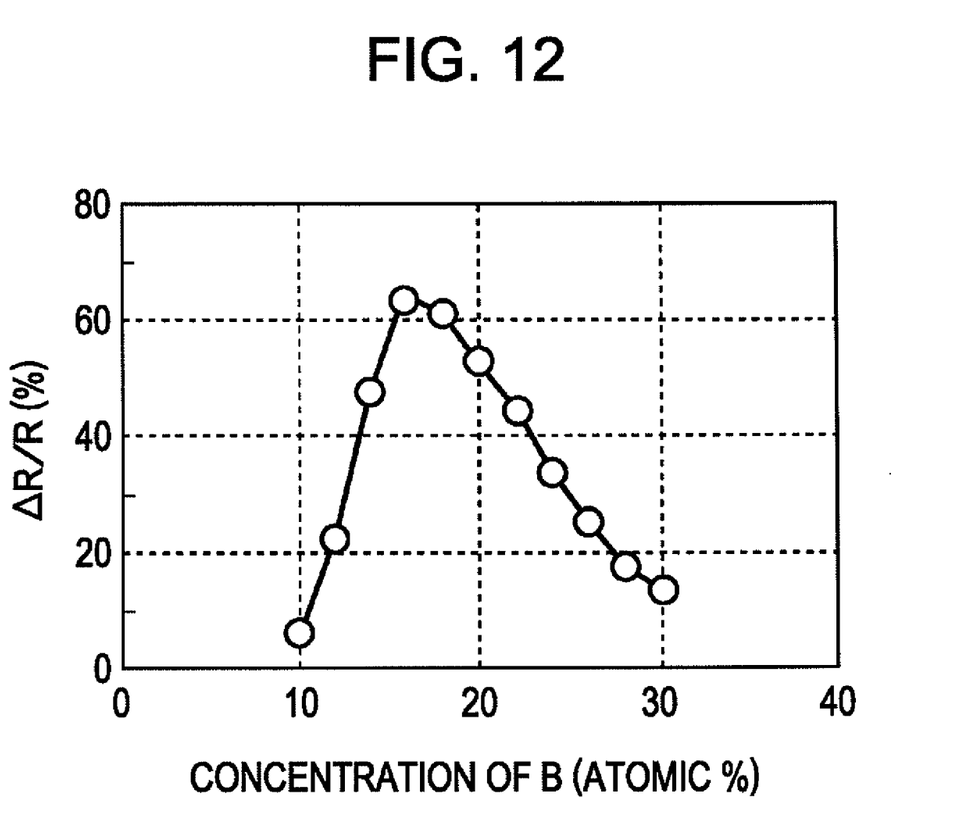
FIG. 12 is a graph illustrating the relationship between the composition of B of a second pinned magnetic sublayer (first magnetic subsublayer) and the rate of resistance change (ΔR/R) in a tunnel magnetoresistive sensor having a known structure.

FIG. 12 shows the rate of resistance change ($\Delta R/R$) as a function of the composition ratio Y of B in CoFeB constituting a second pinned magnetic sublayer in a layered body composed of an underlying layer; Ta (30)/seed layer; Ru (40)/antiferromagnetic layer; IrMn (70)/pinned magnetic layer [first pinned magnetic sublayer; $Co_{70at\%} Fe_{30at\%}$ (22)/nonmagnetic intermediate sublayer; Ru (9.1)/second pinned magnetic sublayer; $(Co_{50\%} Fe_{50\%})_{100-Y}B_Y$ (20)]/insulating barrier layer; Mg—O (11)/free magnetic layer [enhance sublayer; $Co_{50at\%} Fe_{50at\%}$ (10)/soft magnetic sublayer; $Ni_{87at\%} Fe_{13at\%}$ (50)]/protective layer [Ru (20)/Ta (180)] laminated in that order from the bottom. The figures in parentheses are average film thicknesses expressed in angstroms. In this experiment, the layered body was annealed at 270° C. for 3.5 hours.

As shown in FIG. 12, when the composition ratio Y of B was approximately in the range of 15 to 20 atomic percent, the rate of resistance change ($\Delta R/R$) could increase, but was still low. In addition, as shown in FIG. 12, the rate of resistance change ($\Delta R/R$) changed greatly with the composition ratio Y of B. Thus, a high rate of resistance change ($\Delta R/R$) could not consistently be achieved. Although a large composition ratio Y of B promotes amorphization in a non-heat-treated (as deposited) state, a high rate of resistance change ($\Delta R/R$) is not achieved, as shown in FIG. 12, indicating that crystallization does not ocurr with heat treatment.

Japanese Unexamined Patent Application Publication No. 2004-179667 discloses a magnetoresistive sensor in which an enhance sublayer in contact with an insulating barrier layer has a thickness of 2 nm or less. While this patent document discloses an insulating barrier layer formed of Al—O or Mg—O, all the insulating barrier layers described in Examples are formed of alumina (Al—O).

Furthermore, the tunnel magnetoresistive sensor described in Japanese Unexamined Patent Application Publication No. 2005-197764 has a shielding layer formed of a microcrystalline material to minimize the surface roughness of the insulating barrier layer, thus achieving high output. Furthermore, this patent document discloses a pinned layer formed of CoFe or CoFeB, but does not disclose an insulating barrier layer formed of Mg—O.

Thus, both of the above-referenced patent documents do not relate to a tunnel magnetoresistive sensor including an insulating barrier layer formed of Mg—O. In these patent documents, the composition or the structure of a free magnetic layer or a pinned magnetic layer is optimized to improve the characteristics of a tunnel magnetoresistive sensor. Thus, these patent documents do not describe the optimization of the crystal structure of an insulating barrier layer, a free magnetic layer, or a pinned magnetic layer to increase the rate of resistance change ($\Delta R/R$) of the tunnel magnetoresistive sensor.

SUMMARY

In a tunnel magnetoresistive sensor according to the disclosure, a pinned magnetic layer having fixed magnetization, an insulating barrier layer, and a free magnetic layer having variable magnetization according to an external magnetic field are laminated in that order from the bottom, or the free magnetic layer, the insulating barrier layer, and the pinned magnetic layer are laminated in that order from the bottom. The insulating barrier layer is formed of Mg—O. A barrier-layer-side magnetic sublayer, constituting at least part of the pinned magnetic layer and being in contact with the insulating barrier layer, includes a first magnetic region formed of CoFeB or FeB and a second magnetic region formed of CoFe or Fe. The second magnetic region is disposed between the first magnetic region and the insulating barrier layer.

In a preferred embodiment, the first magnetic region preferably includes a composition modulation region in which the concentration of B decreases gradually from a first boundary of the first magnetic region toward the second magnetic region, the first boundary being opposite a second boundary between the first magnetic region and the second magnetic region.

According to another embodiment, a method is disclosed for manufacturing a tunnel magnetoresistive sensor including a layered portion, the layered portion including a pinned magnetic layer having a fixed magnetization direction, an insulating barrier layer, and a free magnetic layer having a variable magnetization direction according to an external magnetic field laminated in that order from the bottom. In the disclosed method a second magnetic subsublayer formed of CoFe or Fe is stacked on a first magnetic subsublayer formed of CoFeB or FeB to form a barrier-layer-side magnetic sublayer constituting at least part of the pinned magnetic layer. An insulating barrier layer formed of Mg—O is formed on the barrier-layer-side magnetic sublayer. The free magnetic layer is formed on the insulating barrier layer.

Alternatively, a method is disclosed for manufacturing a tunnel magnetoresistive sensor including a layered portion, the layered portion including a free magnetic layer having a variable magnetization direction according to an external magnetic field, an insulating barrier layer, and a pinned magnetic layer having a fixed magnetization direction laminated in that order from the bottom. In this disclosed method, the free magnetic layer is formed. An insulating barrier layer formed of Mg—O is formed on the free magnetic layer. And, a second magnetic subsublayer formed of CoFe or Fe and a first magnetic subsublayer formed of CoFeB or FeB is formed on the insulating barrier layer to form a barrier-layer-side magnetic sublayer constituting at least part of the pinned magnetic layer.

A tunnel magnetoresistive sensor including an insulating barrier layer formed of Mg—O according to the present invention can be manufactured easily and appropriately by the manufacturing method described above. The tunnel magnetoresistive sensor can achieve a higher rate of resistance change ($\Delta R/R$) than before.

In the disclosed embodiment, in the formation of the first magnetic subsublayer, the first magnetic subsublayer is preferably formed of $(Co_xFe_{100-x})_{100-Y}B_Y$, wherein the composition ratio Y of B is controlled within the range of 15 to 30 atomic percent.

DESCRIPTION OF THE EMBODIMENTS

Figure 1:
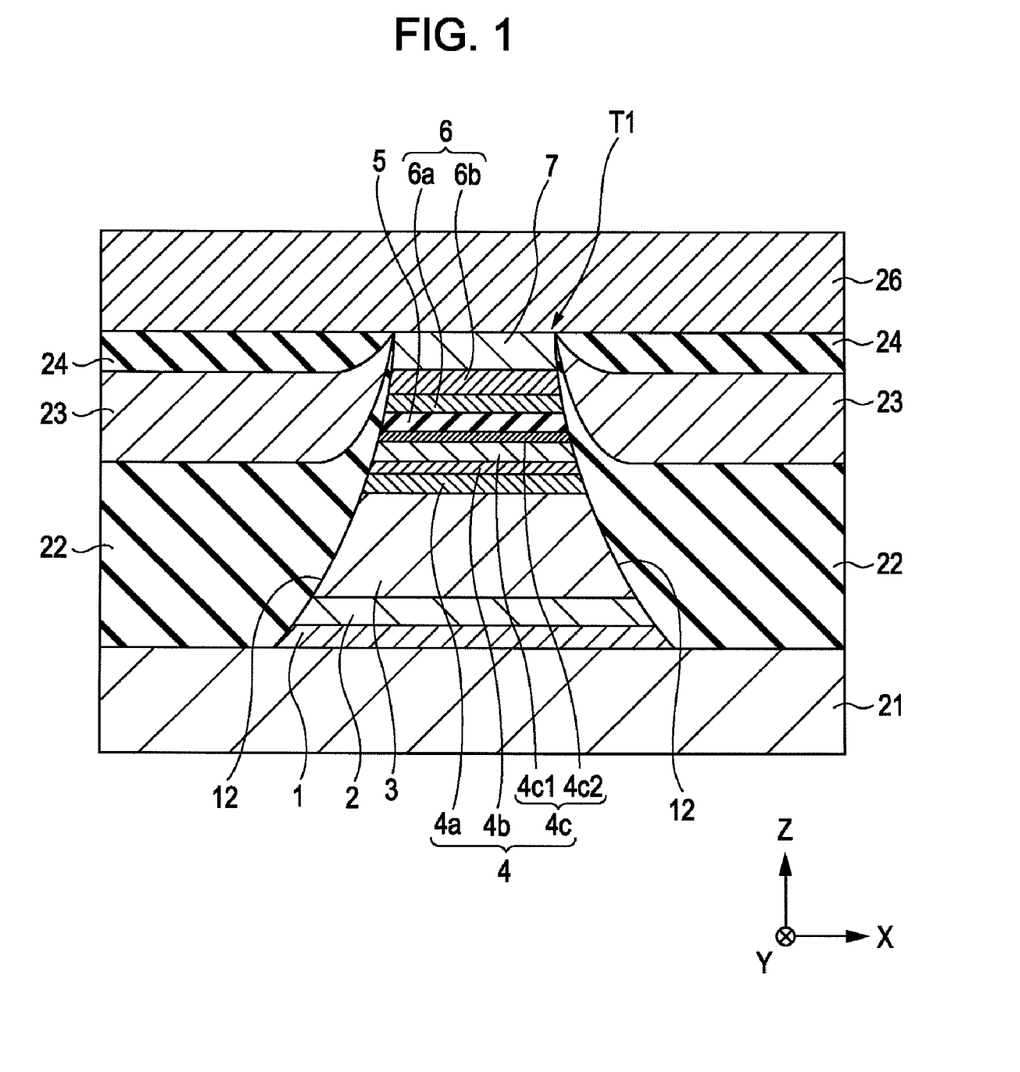
FIG. 1 is a cross-sectional view of a tunnel magnetoresistive sensor according to an embodiment, taken parallel to a plane of a recording medium.

FIG. 1 is a cross-sectional view of a tunnel magnetoresistive sensor (tunnel magnetoresistance effect device) according to an embodiment, taken parallel to a plane of a recording medium.

For example, a tunnel magnetoresistive sensor is installed on a trailing edge of a flying slider in a hard disk drive and detects a recording magnetic field of a hard disk. A tunnel magnetoresistive sensor may also be used in a magnetoresistive random access memory (MRAM).

In FIG. 1, the X direction is a track width direction. The Y direction is a direction of a leakage field from a magnetic recording medium (height direction). The Z direction is a direction of movement of a magnetic recording medium such as a hard disk and a lamination direction of the tunnel magnetoresistive sensor.

The bottom layer in FIG. 1 is a first shielding layer 21, for example, formed of a NiFe alloy. The layered body T1 is formed on the first shielding layer 21. The tunnel magnetoresistive sensor is composed of the layered body T1, first insulating layers 22 formed on both sides of the layered body T1 in the track width direction (X direction in FIG. 1), hard bias layers 23, and second insulating layers 24.

The bottom layer of the layered body T1 is an underlying layer 1 formed of a nonmagnetic material composed of at least one element selected from the group consisting of Ta, Hf, Nb, Zr, Ti, Mo, and W.

A seed layer 2 is formed on the underlying layer 1. The seed layer 2 may be formed of Ru or NiFeCr. The seed layer 2 formed of NiFeCr has equivalent crystal faces of a face-centered cubic (fcc) structure represented by a {111} plane preferentially oriented parallel to the seed layer 2. The seed layer 2 formed of Ru has equivalent crystal faces of a hexagonal closest packed (hcp) structure represented by a {000} plane preferentially oriented parallel to the seed layer 2. The underlying layer 1 may be eliminated.

An antiferromagnetic layer 3 formed on the seed layer 2 is preferably formed of an antiferromagnetic material containing an element α (wherein α is one or at least two elements selected from the group consisting of Pt, Pd, Ir, Rh, Ru, and Os) and Mn.

α-Mn alloys containing an element of the platinum group have excellent characteristics as antiferromagnetic materials, such as high corrosion resistance and high blocking temperature. Furthermore, the α-Mn alloys can have an increased exchange coupling magnetic field (Hex).

Alternatively, the antiferromagnetic layer 3 may be formed of an antiferromagnetic material containing an element α, an element α' (wherein the element α' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

A pinned magnetic layer 4 is formed on the antiferromagnetic layer 3. The pinned magnetic layer 4 has a layered ferri structure including a first pinned magnetic sublayer 4a, a nonmagnetic intermediate sublayer 4b, and a second pinned magnetic sublayer (barrier-layer-side magnetic sublayer) 4c laminated in that order from the bottom. The directions of magnetization of the first pinned magnetic sublayer 4a and the second pinned magnetic sublayer 4c are brought into an antiparallel state by an exchange coupling magnetic field at an interface between the antiferromagnetic layer 3 and the pinned magnetic layer 4 and an antiferromagnetic exchange coupling magnetic field via the nonmagnetic intermediate sublayer 4b (RKKY interaction). This is a so-called layered ferri structure. This structure can stabilize the magnetization of the pinned magnetic layer 4 and apparently increase an exchange coupling magnetic field generated at the interface between the pinned magnetic layer 4 and the antiferromagnetic layer 3. For example, the first pinned magnetic sublayer 4a has a thickness in the range of about 1.2 to about 3.2 nm (about 12 to about 32 angstroms), the nonmagnetic intermediate sublayer 4b has a thickness approximately in the range of about 0.8 to about 1 nm (about 8 to about 10 angstroms), and the second pinned magnetic sublayer 4c has a thickness in the range of about 1.6 to about 4.2 nm (about 16 to about 42 angstroms).

The first pinned magnetic sublayer 4a is formed of a ferromagnetic material such as CoFe, NiFe, or CoFeNi. The nonmagnetic intermediate sublayer 4b is formed of a nonmagnetic conductive material such as Ru, Rh, Ir, Cr, Re, or Cu.

In the present embodiment, the second pinned magnetic sublayer 4c is composed of a first magnetic subsublayer 4c1 formed of CoFeB or FeB and a second magnetic subsublayer 4c2 formed of CoFe or Fe.

An insulating barrier layer 5 formed on the pinned magnetic layer 4 is formed of magnesium oxide (Mg—O). The insulating barrier layer 5 has a thickness approximately in the range of about 0.6 to about 1.2 nm. Mg—O preferably contains about 40 to about 60 atomic percent of Mg and is most preferably $Mg_{50at\%}O_{50at\%}$.

Furthermore, a Mg layer having a very small thickness (for example, about 1 to about 6 angstroms) may be formed between the insulating barrier layer 5 and the second pinned magnetic sublayer 4c.

A free magnetic layer 6 is formed on the insulating barrier layer 5. The free magnetic layer 6 is composed of a soft magnetic sublayer 6b formed of a magnetic material such as a NiFe alloy and an enhance sublayer 6a formed of a CoFe alloy. The enhance sublayer 6a is disposed between the soft magnetic sublayer 6b and the insulating barrier layer 5. Preferably, the soft magnetic sublayer 6b is formed of a magnetic material having excellent soft magnetism. The enhance sublayer 6a is formed of a magnetic material having spin polarizability larger than that of the soft magnetic sublayer 6b. The enhance sublayer 6a formed of a CoFe alloy having large spin polarizability can improve the rate of resistance change (ΔR/R).

The free magnetic layer 6 may be a layered ferri structure in which a plurality of magnetic sublayers is laminated with nonmagnetic intermediate sublayers. The width of the free magnetic layer 6 in the track width direction (X direction in FIG. 1) defines the track width Tw.

A protective layer 7, for example, formed of Ta is formed on the free magnetic layer 6.

End faces 12 on both sides of the layered body T1 in the track width direction (X direction in FIG. 1) have inclined faces formed such that the width of the layered body T1 in the track width direction decreases gradually from the bottom to the top.

As illustrated in FIG. 1, the first insulating layers 22 disposed on both sides of the layered body T1 are formed on the first shielding layer 21 along the end faces 12 of the layered body T1. The hard bias layers 23 are formed on the first insulating layers 22. The second insulating layers 24 are formed on the hard bias layers 23.

Bias underlying layers (not shown) may be formed between the first insulating layers 22 and the hard bias layers 23. The bias underlying layers may be formed of Cr, W, and/or Ti.

The first insulating layers 22 and the second insulating layers 24 are formed of an insulating material such as $Al_2O_3$ or $SiO_2$. The first insulating layers 22 and the second insulating layers 24 insulate the hard bias layers 23 to prevent an electric current flowing through the layered body T1 in a direction perpendicular to the interfaces of the layers of the layered body T1 from being shunted to both sides of the layered body T1 in the track width direction. For example, the hard bias layers 23 are formed of a Co—Pt (cobalt-platinum) alloy or a Co—Cr—Pt (cobalt-chromium-platinum) alloy.

A second shielding layer 26, for example, formed of a NiFe alloy is formed on the layered body T1 and the second insulating layers 24.

In the embodiment illustrated in FIG. 1, the first shielding layer 21 and the second shielding layer 26 function as electrode layers of the layered body T1. Thus, an electric current flows in a direction perpendicular to the layers of the layered body T1 (in a direction parallel to the Z direction in FIG. 1).

The free magnetic layer 6 is magnetized in a direction parallel to the track width direction (X direction in FIG. 1) under the influence of a bias magnetic field of the hard bias layers 23. The first pinned magnetic sublayer 4a and the second pinned magnetic sublayer 4c together constituting the pinned magnetic layer 4 are magnetized in a direction parallel to the height direction (Y direction in FIG. 1). Because the pinned magnetic layer 4 has a layered ferri structure, the magnetization of the first pinned magnetic sublayer 4a is antiparallel to the magnetization of the second pinned magnetic sublayer 4c. While the magnetization of the pinned magnetic layer 4 is fixed (an external magnetic field does not change the magnetization), the magnetization of the free magnetic layer 6 changes with the external magnetic field.

When the magnetization of the second pinned magnetic sublayer 4c is antiparallel to the magnetization of the free magnetic layer 6, a change in the magnetization of the free magnetic layer 6 caused by an external magnetic field reduces a tunneling current flowing through the insulating barrier layer 5 disposed between the second pinned magnetic sublayer 4c and the free magnetic layer 6, thus maximizing the resistance. On the other hand, when the magnetization of the second pinned magnetic sublayer 4c is parallel to the magnetization of the free magnetic layer 6, a change in the magnetization of the free magnetic layer 6 caused by an external magnetic field maximizes the tunneling current, thus minimizing the resistance.

According to this principle, an external magnetic field changes the magnetization of the free magnetic layer 6 and thereby changes the electrical resistance. The tunnel magnetoresistive sensor detects the change in electrical resistance as a voltage change and thereby detects a leakage field from a recording medium.

The features of the embodiment illustrated in FIG. 1 will be described below.

In FIG. 1, the insulating barrier layer 5 is formed of magnesium oxide (Mg—O). The second pinned magnetic sublayer 4c constituting the pinned magnetic layer 4 underlying the insulating barrier layer 5 is formed in contact with the insulating barrier layer 5. The second pinned magnetic sublayer 4c is composed of the first magnetic subsublayer 4c1 formed of CoFeB or FeB and the second magnetic subsublayer 4c2 formed of CoFe or Fe. The second magnetic subsublayer 4c2 is disposed between the first magnetic subsublayer 4c1 and the insulating barrier layer 5.

Experiments described below show that this structure can achieve a higher rate of resistance change ($\Delta R/R$) than a conventional example in which the second pinned magnetic sublayer 4c is formed of a CoFeB monolayer. Thus, a tunnel magnetoresistive sensor can have a high head output even at a narrower track.

As in the present embodiment, when the first magnetic subsublayer 4c1 formed of CoFeB or FeB having a tendency of becoming amorphous is formed on the nonmagnetic intermediate sublayer 4b in a non-heat-treated (as deposited) state, the first magnetic subsublayer 4c1 may block the influence of the crystalline orientation exerted by the crystal structures of from the seed layer 2 to the nonmagnetic intermediate sublayer 4b (for example, the orientation of a face-centered cubic structure {111} plane). Hence, the crystal structures of the second magnetic subsublayer 4c2, the insulating barrier layer 5, and the free magnetic layer 6 formed on the first magnetic subsublayer 4c1 may be less affected by the crystalline orientation of the crystal structures of from the seed layer 2 to the nonmagnetic intermediate sublayer 4b. In the present embodiment, since the second magnetic subsublayer 4c2 formed of CoFe or Fe, which is easy to crystallize, is formed on the first magnetic subsublayer 4c1, preferred orientation of equivalent crystal faces of a body-centered cubic (bcc) structure represented by a {100} plane tends to occur in the second pinned magnetic sublayer 4c, the insulating barrier layer 5, and the enhance sublayer 6a formed of CoFe after heat treatment. The phrase "crystal faces represented by a {100} plane" refers to crystal faces expressed by Miller indices. The equivalent crystal faces represented by a {100} plane include a (100) plane, a (−100) plane, a (010) plane a (0-10) plane, a (001) plane, and a (00-1) plane.

Thus, the present embodiment can achieve a higher rate of resistance change ($\Delta R/R$) than before.

In the present embodiment, the thickness of the first magnetic subsublayer 4c1 is preferably in the range of about 10 to about 30 angstroms and is more preferably in the range of about 16 to about 24 angstroms. According to an experiment described below, a change in the thickness of the first magnetic subsublayer 4c1 does not cause a large change in the rate of resistance change ($\Delta R/R$). However, because an increased thickness of the first magnetic subsublayer 4c1 results in an increase in the B content in the entire second pinned magnetic sublayer 4c, it will have an influence on the crystallization of the second magnetic subsublayer 4c2 formed on the first magnetic subsublayer 4c1. Hence, the thickness of the first magnetic subsublayer 4c1 is preferably in the range described above.

Furthermore, the thickness of the second magnetic subsublayer 4c2 is preferably in the range of about 6 to about 12 angstroms and is more preferably in the range of about 7 to about 11 angstroms. According to an experiment described below, when the thickness of the second magnetic subsublayer is smaller than 6 angstroms or larger than 12 angstroms, the rate of resistance change ($\Delta R/R$) is not increased. In contrast, when the thickness of a second magnetic subsublayer 4c2 is in the range of 7 to 11 angstroms, a high rate of resistance change ($\Delta R/R$) is achieved consistently. According to another experiment described below, the thickness of the second magnetic subsublayer 4c2 in the range described above can reduce the interlayer coupling magnetic field (Hin) between the free magnetic layer 6 and the pinned magnetic layer 4. Furthermore, in terms of the interlayer coupling magnetic field (Hin), the thickness of the second magnetic subsublayer 4c2 is preferably as large as possible within the range described above.

In the present embodiment, the first magnetic subsublayer 4c1 is preferably formed of $(Co_XFe_{100-X})_{100-Y}B_Y$, wherein the composition ratio Y of B is in the range of 15 to 30 atomic percent. The composition of the first magnetic subsublayer 4c1 can be controlled within the range described above to achieve a high rate of resistance change ($\Delta R/R$).

Furthermore, the atomic ratio X {composition ratio of Co/(composition ratio of Co+composition ratio of Fe)} is preferably in the range of about 0% to about 80%.

The second magnetic subsublayer 4c2 is preferably formed of $Co_ZFe_{100-Z}$, wherein the composition ratio Z of Co is in the range of about 0 to about 80 atomic percent. More preferably, the composition ratio Z of Co is in the range of about 10 to about 50 atomic percent.

As described below, a tunnel magnetoresistive sensor is subjected to annealing (heat treatment) in a manufacturing process. For example, annealing is performed at a temperature approximately in the range of 200° C. to 310° C. Annealing may be performed in a magnetic field to generate an exchange coupling magnetic field (Hex) between the first pinned magnetic sublayer 4a constituting the pinned magnetic layer 4 and the antiferromagnetic layer 3.

For example, when the annealing temperature is lower than 200° C., no interdiffusion of a component element may occur at an interface between the second magnetic subsublayer 4c2 and the first magnetic subsublayer 4c1, or, if any, the interdiffusion of a component element may occur on a small scale (for example, the interdiffusion does not occur over the entire interface but occurs intermittently). Thus, the state of the interface may be almost maintained.

Figure 2:
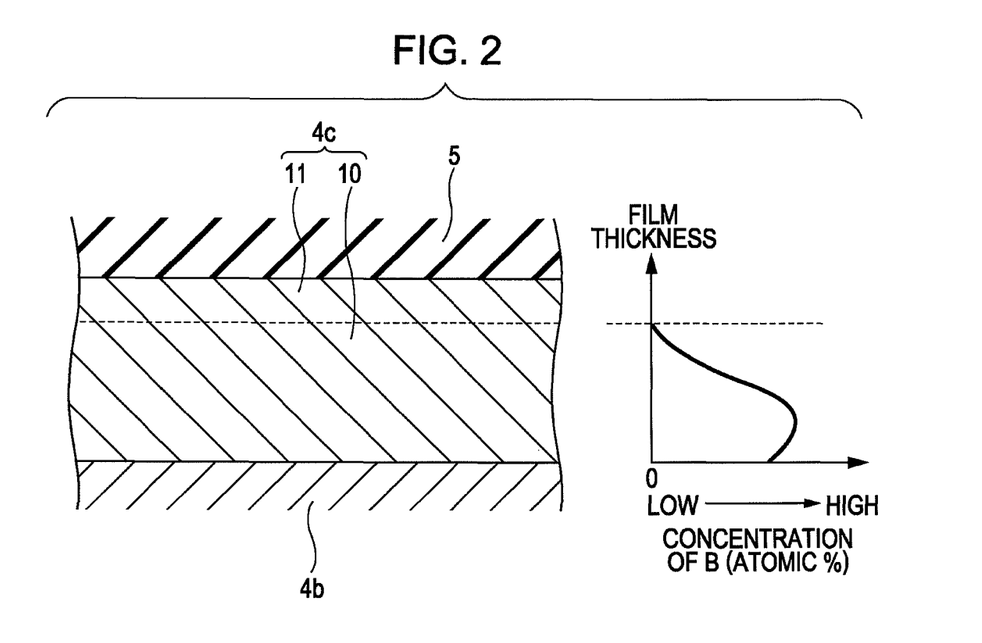
FIG. 2 is a fragmentary enlarged cross-sectional view of the vicinity of a second pinned magnetic sublayer 4c illustrated in FIG. 1, particularly illustrating element diffusion at an interface between a first magnetic subsublayer and a second magnetic subsublayer, and a graph illustrating composition modulation with respect to the concentration of B.
Figure 3:
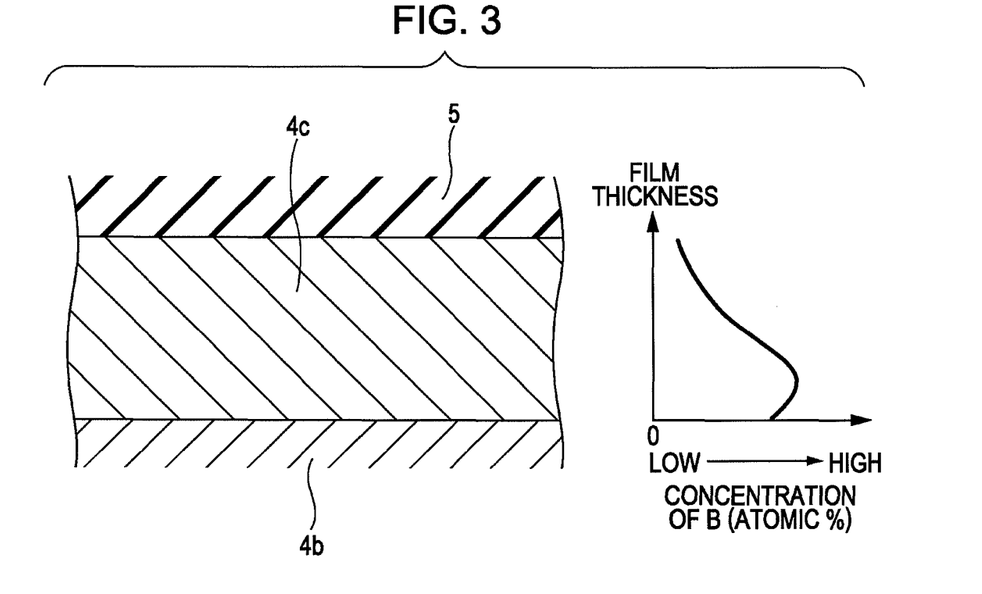
FIG. 3 is a fragmentary enlarged cross-sectional view of the vicinity of a second pinned magnetic sublayer 4c according to another embodiment of the present invention, and a graph illustrating composition modulation with respect to the concentration of B.

On the other hand, when the annealing temperature is in the range of 200° C. to 310° C. and the annealing time is at least four hours, the interdiffusion of a component element may occur at an interface between the second magnetic subsublayer 4c2 and the first magnetic subsublayer 4c1, as illustrated in FIG. 2 or 3. The interdiffusion of a component element can eliminate the interface and form a composition modulation region with respect to the concentration of B.

In an embodiment illustrated in FIG. 2, element diffusion occurs at an interface between the second magnetic subsublayer 4c2 and the first magnetic subsublayer 4c1. The second pinned magnetic sublayer 4c is composed of a first magnetic region 10 formed of CoFeB or FeB and a second magnetic region 11 formed of CoFe or Fe. The second magnetic region 11 is disposed between the first magnetic region 10 and the insulating barrier layer 5.

As shown in FIG. 2, the second magnetic region 11 is free of B. As shown in an inset in FIG. 2, the first magnetic region 10 includes a composition modulation region in which the concentration of B decreases gradually from an undersurface (interface in contact with the nonmagnetic intermediate sublayer 4b) toward the second magnetic region 11. The concentration of B in the vicinity of the undersurface of the first magnetic region 10 is lower than that in the inside of the first magnetic region 10. This results from element diffusion between the first magnetic region 10 and the nonmagnetic intermediate sublayer 4b.

On the other hand, in an embodiment illustrated in FIG. 3, the second pinned magnetic sublayer 4c is entirely formed of CoFeB. The concentration of B is lower in the top surface side in contact with the insulating barrier layer 5 than in the undersurface side in contact with the nonmagnetic intermediate sublayer 4b. As shown in FIG. 3, the second pinned magnetic sublayer 4c includes a composition modulation region in which the concentration of B decreases gradually from the undersurface side in contact with the nonmagnetic intermediate sublayer 4b to the top surface side in contact with the insulating barrier layer 5. Furthermore, as shown in FIG. 3, the concentration of B in the vicinity of the undersurface of the second pinned magnetic sublayer 4c is lower than that in the inside of the second pinned magnetic sublayer 4c. This results from element diffusion between the second pinned magnetic sublayer 4c and the nonmagnetic intermediate sublayer 4b.

In the embodiment illustrated in FIG. 1, the pinned magnetic layer 4 has a layered ferri structure composed of the first pinned magnetic sublayer 4a, the nonmagnetic intermediate sublayer 4b, and the second pinned magnetic sublayer 4c. However, the present embodiment can be applied to the pinned magnetic layer 4 having a monolayer structure or a layered structure composed of a plurality of magnetic layers. In the pinned magnetic layer 4 having a layered ferri structure, the magnetization of the pinned magnetic layer 4 can be fixed more appropriately. The pinned magnetic layer 4 having a layered ferri structure is therefore suitable to improve the playback output.

The embodiment illustrated in FIG. 1 is a so-called bottom-type tunnel magnetoresistive sensor, in which the insulating barrier layer 5 is formed on the pinned magnetic layer 4. The present embodiment can also be applied to a so-called top-type layered structure, in which the pinned magnetic layer 4 is formed on the insulating barrier layer 5. In the top-type layered structure, the free magnetic layer 6, the insulating barrier layer 5, the pinned magnetic layer 4, and the antiferromagnetic layer 3 are laminated in that order from the bottom. The second pinned magnetic sublayer 4c constituting the pinned magnetic layer 4 is composed of the second magnetic subsublayer 4c2 formed of CoFe or Fe and the first magnetic subsublayer 4c1 formed of CoFeB or FeB laminated in that order from the bottom. Element diffusion may occur between the second magnetic subsublayer 4c2 and the first magnetic subsublayer 4c1.

The present embodiment can also be applied to a dual-type tunnel magnetoresistive sensor composed of a first antiferromagnetic layer, a first pinned magnetic layer, a first insulating barrier layer, a free magnetic layer, a second insulating barrier layer, a second pinned magnetic layer, and a second antiferromagnetic layer laminated in that order from the bottom. The structure of the first pinned magnetic layer is described in FIGS. 1 to 3. The structure of the second pinned magnetic layer is described for the top-type layered structure.

A method for manufacturing a tunnel magnetoresistive sensor according to the present embodiment will be described below. FIGS. 4 to 7 are fragmentary sectional views of a tunnel magnetoresistive sensor in a manufacturing process, taken in the same direction as in FIG. 1.

Figure 4:
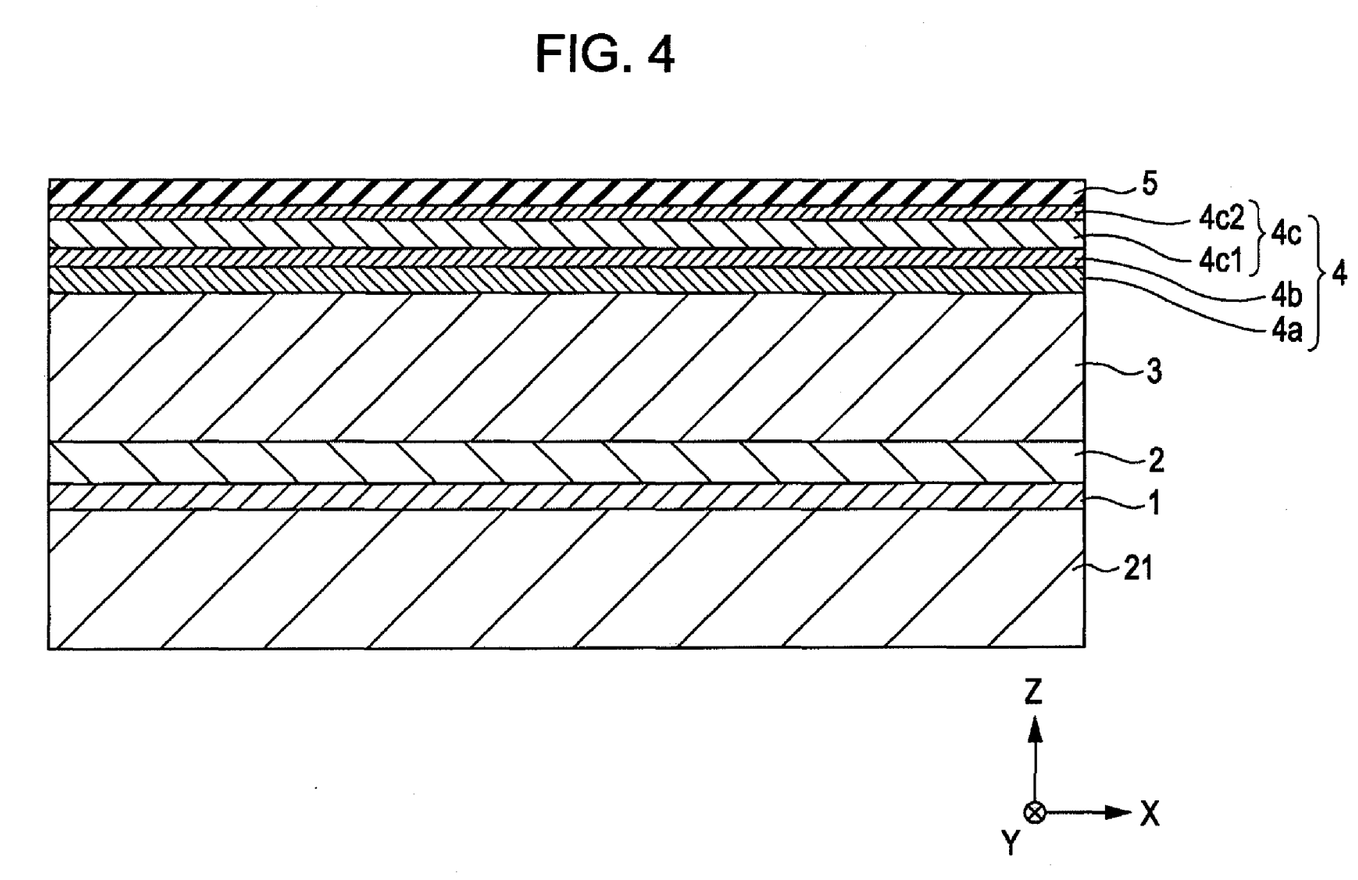
FIG. 4 is a process drawing of a method for manufacturing a tunnel magnetoresistive sensor according to an embodiment of the present invention (a cross-sectional view of the tunnel magnetoresistive sensor in a manufacturing process, taken parallel to a plane of a recording medium)

In a process illustrated in FIG. 4, an underlying layer 1, a seed layer 2, an antiferromagnetic layer 3, a first pinned magnetic sublayer 4a, a nonmagnetic intermediate sublayer 4b, and a second pinned magnetic sublayer 4c are successively formed on a first shielding layer 21. These layers may be deposited by sputtering.

In the present embodiment, as illustrated in FIG. 2, the second pinned magnetic sublayer 4c is composed of a first magnetic subsublayer 4c1 formed of CoFeB or FeB and a second magnetic subsublayer 4c2 formed of CoFe or Fe laminated in that order from the bottom.

The first magnetic subsublayer 4c1 is preferably formed of $(Co_XFe_{100-X})_{100-Y}B_Y$, wherein the composition ratio Y of B is in the range of about 15 to about 30 atomic percent, and the atomic ratio X is in the range of about 0% to about 80%.

Furthermore, the first magnetic subsublayer 4c1 preferably has an average thickness in the range of about 10 to about 30 angstroms. This can achieve a high rate of resistance change ($\Delta R/R$).

Furthermore, the second magnetic subsublayer 4c2 is preferably formed of $Co_ZFe_{100-Z}$, wherein the composition ratio Z of Co is controlled within the range of about 0 to about 80 atomic percent. Furthermore, the second magnetic subsublayer 4c2 preferably has an average thickness in the range of about 6 to about 12 angstroms. This can achieve a high rate of resistance change ($\Delta R/R$).

The surface of the second pinned magnetic sublayer 4c is then subjected to plasma processing. The plasma processing is performed to improve the flatness of the surface of the second pinned magnetic sublayer 4c. As in the present embodiment, in a structure in which a thin second magnetic subsublayer 4c2 is formed on a sufficiently flat first magnetic subsublayer 4c1, the surface of the second pinned magnetic sublayer 4c is also sufficiently flat. The plasma processing may therefore be eliminated.

An insulating barrier layer 5 formed of Mg—O is then formed on the second pinned magnetic sublayer 4c. In the present embodiment, the insulating barrier layer 5 formed of Mg—O is directly formed, for example, by RF sputtering, using a Mg—O target.

Alternatively, a Mg layer may be formed on the second pinned magnetic sublayer 4c by sputtering, and the Mg layer may be oxidized to form the insulating barrier layer 5 formed of Mg—O. Examples of the oxidizing method include radical oxidation, ion oxidation, plasma oxidation, and natural oxidation. The Mg layer has a thickness approximately in the range of about 2 to about 10 angstroms.

Figure 5:
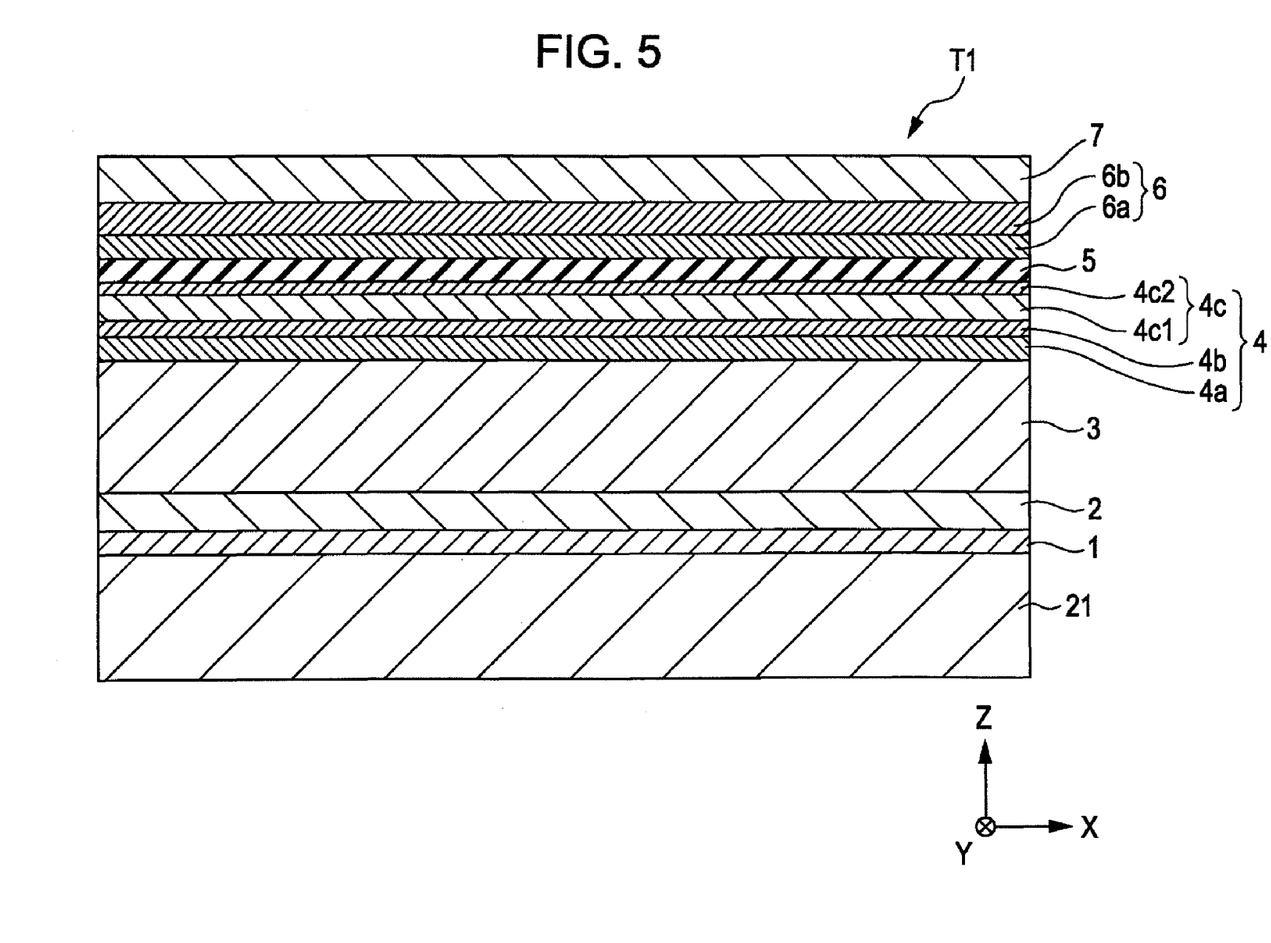
FIG. 5 is a process drawing following FIG. 4 (a cross-sectional view of the tunnel magnetoresistive sensor in a manufacturing process, taken parallel to a plane of a recording medium)
Figure 6:
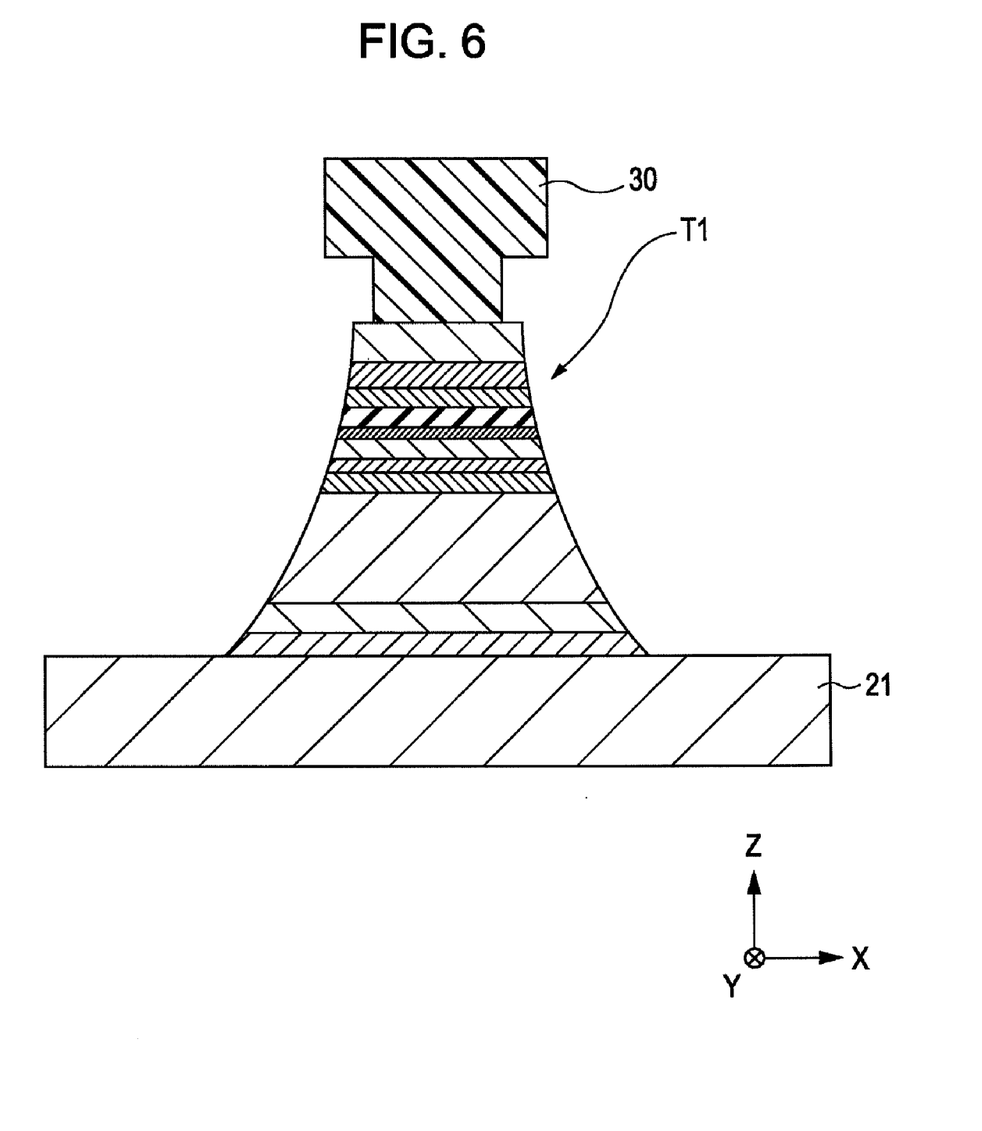
FIG. 6 is a process drawing following FIG. 5 (a cross-sectional view of the tunnel magnetoresistive sensor in a manufacturing process, taken parallel to a plane of a recording medium)

In a process illustrated in FIG. 5, a free magnetic layer 6 composed of an enhance sublayer 6a and a soft magnetic sublayer 6b, and a protective layer 7 are formed on the insulating barrier layer 5.

In the present embodiment, the enhance sublayer 6a is preferably formed of CoFe in which the Fe composition ratio is in the range of about 5 to about 90 atomic percent. Furthermore, the soft magnetic sublayer 6b is preferably formed of a NiFe alloy in which the Ni composition ratio is in the range of about 78 to about 92 atomic percent.

Thus, a layered body T1 including from the underlying layer 1 to the protective layer 7 is formed.

A lift-off resist layer 30 is then formed on the layered body T1. Both ends of the layered body T1 in the track width direction (X direction) that are not covered with the lift-off resist layer 30 are removed, for example, by etching (see FIG. 6).

Figure 7:
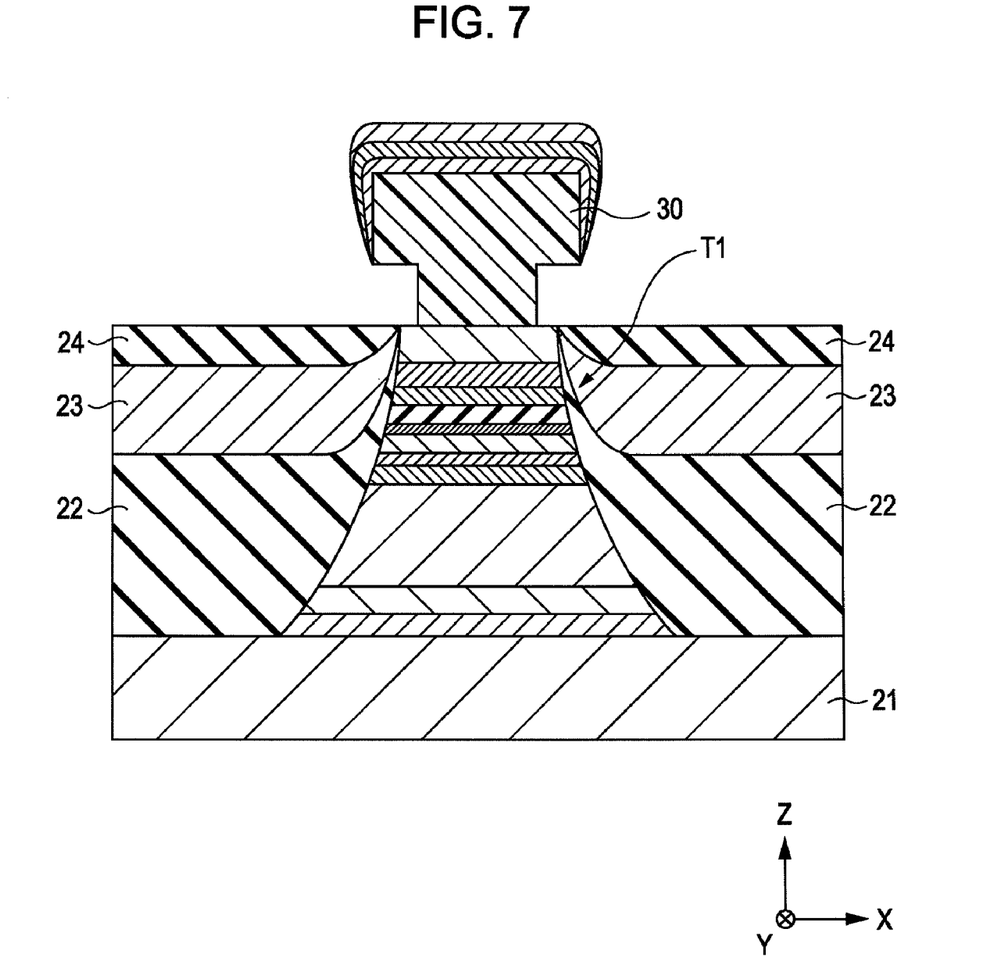
FIG. 7 is a process drawing following FIG. 6 (a cross-sectional view of the tunnel magnetoresistive sensor in a manufacturing process, taken parallel to a plane of a recording medium)

First insulating layers 22, hard bias layers 23, and second insulating layers 24 are then stacked on the first shielding layer 21 on both sides of the layered body T1 in the track width direction (X direction) in that order from the bottom (see FIG. 7).

The lift-off resist layer 30 is then removed to form a second shielding layer 26 on the layered body T1 and the second insulating layers 24.

The method for manufacturing a tunnel magnetoresistive sensor described above includes annealing. Annealing is typically performed to generate an exchange coupling magnetic field (Hex) between the antiferromagnetic layer 3 and the first pinned magnetic sublayer 4a.

When the annealing temperature is lower than 200° C., no interdiffusion of a component element may occur at interfaces between the layers, or, if any, the interdiffusion of a component element may occur on a small scale (for example, the interdiffusion does not occur over the entire interface but occurs intermittently). Thus, the state of the interface may be almost maintained.

On the other hand, for example, when the annealing temperature is in the range of about 200° C. to about 310° C. and the annealing time is at least four hours, the interdiffusion of a component element may occur at interfaces between the layers. The interdiffusion of a component element can eliminate an interface between the first magnetic subsublayer 4c1 and the second magnetic subsublayer 4c2 in the second pinned magnetic sublayer 4c and form a composition modulation region with respect to the concentration of B.

In the present embodiment, a tunnel magnetoresistive sensor that can achieve a high rate of resistance change ($\Delta R/R$) can easily and appropriately be manufactured by the manufacturing methods described above.

In particular, the two-layered structure of the second pinned magnetic sublayer 4c composed of the first magnetic subsublayer 4c1 and the second magnetic subsublayer 4c2 as described above can achieve a higher rate of resistance change ($\Delta R/R$) than a conventional example in which the second pinned magnetic sublayer 4c is formed of a CoFeB monolayer.

The manufacturing method according to the present embodiment is a method for manufacturing a so-called bottom-type tunnel magnetoresistive sensor. However, the manufacturing method can be applied to so-called top-type tunnel magnetoresistive sensors or dual-type tunnel magnetoresistive sensors.

EXAMPLES

A tunnel magnetoresistive sensor illustrated in FIG. 1 was formed.

A layered body T1 was composed of an underlying layer 1; Ta (30)/seed layer 2; Ru (40)/antiferromagnetic layer 3; IrMn (70)/pinned magnetic layer 4 [first pinned magnetic sublayer 4a; $Co_{70at\%}Fe_{30at\%}$ (22)/nonmagnetic intermediate sublayer 4b; Ru (9.1)/second pinned magnetic sublayer 4c; $(Co_{50\%}Fe_{50\%})_{100-Y}B_Y$ (20)]/insulating barrier layer 5; Mg—O (11)/free magnetic layer 6 [enhance sublayer 6a; $Co_{50at\%}Fe_{50at\%}$ (10)/soft magnetic sublayer 6b; $Ni_{87at\%}Fe_{13at\%}$ (50)]/protective layer 7 [Ru (20)/Ta (180)] laminated in that order from the bottom. The figures in parentheses are average film thicknesses expressed in angstrom.

The surface of the second pinned magnetic sublayer 4c was subjected to plasma processing before the formation of the insulating barrier layer 5. The insulating barrier layer 5 was then formed on the second pinned magnetic sublayer 4c by sputtering using a Mg—O target.

In the examples, the layered body was annealed at 270° C. for 3.5 hours.

In the examples, the following structures were formed as the second pinned magnetic sublayer 4c.

Example 1

A layered structure composed of $(Co_{50\%}Fe_{50\%})_{85at\%}B_{15at\%}$ (22)/$Co_{50at\%}Fe_{50at\%}$ (4) laminated in that order from the bottom.

Example 2

A layered structure composed of $(Co_{50\%}Fe_{50\%})_{77at\%}B_{23at\%}$ (20)/$Co_{50at\%}Fe_{50at\%}$ (6) laminated in that order from the bottom.

Example 3

A layered structure composed of $(Co_{50\%}Fe_{50\%})_{70at\%}B_{30at\%}$ (18)/$Co_{50at\%}Fe_{50at\%}$ (8) laminated in that order from the bottom.

Example 4

A layered structure composed of $(Co_{50\%}Fe_{50\%})_{70at\%}B_{30at\%}$ (t1)/$Co_{50at\%}Fe_{50at\%}$ (8) laminated in that order from the bottom, wherein the thickness t1 of a first magnetic subsublayer 4c1 is 16, 18, 20, 22, or 24 angstroms.

Example 5

A layered structure composed of $(Co_{50\%}Fe_{50\%})_{70at\%}B_{30at\%}$ (t1)/$Co_{50at\%}Fe_{50at\%}$ (9) laminated in that order from the bottom, wherein the thickness t1 of a first magnetic subsublayer 4c1 is 16, 18, 20, 22, or 24 angstroms.

Example 6

A layered structure composed of $(Co_{50\%}Fe_{50\%})_{70at\%}B_{30at\%}$ (t1)/$Co_{50at\%}Fe_{50at\%}$ (10) laminated in that order from the bottom, wherein the thickness t1 of a first magnetic subsublayer 4c1 is 16, 18, 20, 22, or 24 angstroms.

Examples 7 to 13

A layered structure composed of $(Co_{50\%}Fe_{50\%})_{70at\%}B_{30at\%}$ (20)/$Co_{50at\%}Fe_{50at\%}$ (t2) laminated in that order from the bottom, wherein the thickness t2 of a second magnetic subsublayer 4c2 is 6, 7, 8, 9, 10, 11, or 12 angstroms.

Comparative Example 1

$(Co_{50\%}Fe_{50\%})_{80at\%}B_{20at\%}$ (26) monolayer structure

The figures in parentheses in Examples 1 to 12 and Comparative Example 1 are average film thicknesses expressed in angstroms.

For tunnel magnetoresistive sensors including the second pinned magnetic sublayers 4c having these structures, the rate of resistance change ($\Delta R/R$), RA (resistance R×area A), and the interlayer coupling magnetic field (Hin) were determined.

Figure 8:
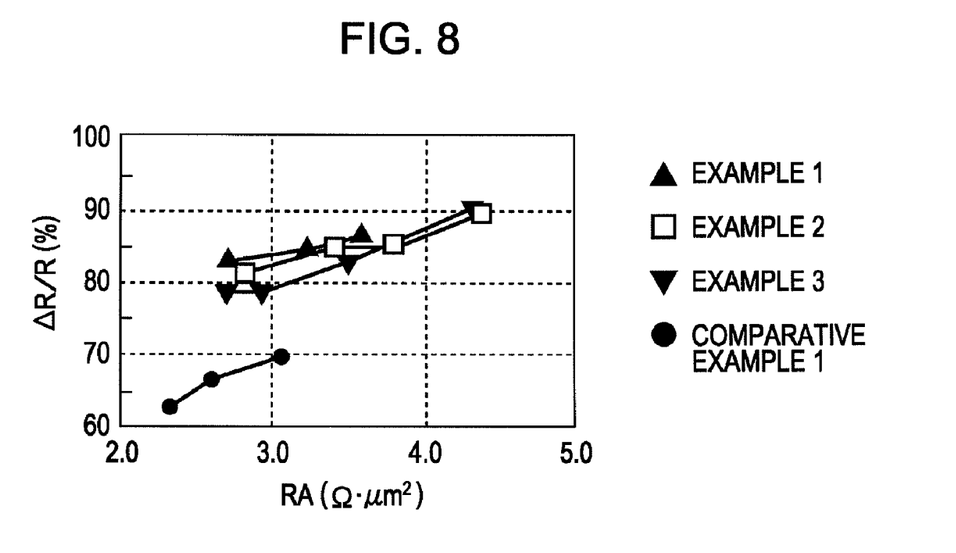
FIG. 8 is a graph illustrating the relationship between RA and the rate of resistance change ($\Delta R/R$) in tunnel magnetoresistive sensors including a second pinned magnetic sublayer having a two-layered structure composed of a first magnetic subsublayer and a second magnetic subsublayer and a tunnel magnetoresistive sensor including a second pinned magnetic sublayer having a monolayer structure of a first magnetic subsublayer.

FIG. 8 shows the relationship between RA and the rate of resistance change ($\Delta R/R$) in Examples 1 to 3 and Comparative Example 1. In an experiment shown in FIG. 8, RA of each sample of Examples 1 to 3 and Comparative Example 1 was changed by changing the thickness of the insulating barrier layer 5 formed of Mg—O within the range of 8 to 12 angstroms.

As shown in FIG. 8, Examples 1 to 3, in which the second pinned magnetic sublayer 4c was a layered structure composed of the first magnetic subsublayer 4c1 and the second magnetic subsublayer 4c2, had a higher rate of resistance change ($\Delta R/R$) than Comparative Example 1, in which the second pinned magnetic sublayer 4c was formed only of the first magnetic subsublayer. Furthermore, while Examples 1 to 3 had a little larger RAs than Comparative Example 1, it does not have a large effect on the characteristics of a head.

Figure 9:
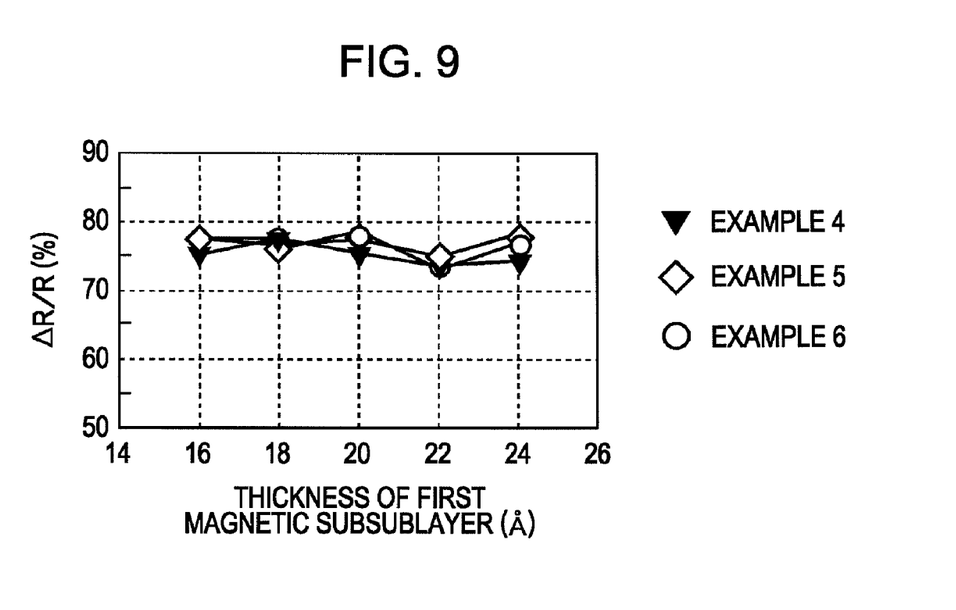
FIG. 9 is a graph illustrating the relationship between the thickness of a first magnetic subsublayer and the rate of resistance change ($\Delta R/R$) in tunnel magnetoresistive sensors including a second pinned magnetic sublayer having a two-layered structure composed of the first magnetic subsublayer and a second magnetic subsublayer.

FIG. 9 shows the relationship between the thickness (t1) of a first magnetic subsublayer 4c1 and the rate of resistance change ($\Delta R/R$) in Examples 4 to 6.

FIG. 9 shows that, when the thickness of a first magnetic subsublayer 4c1 formed of CoFeB was in the range of 16 to 24 angstroms, the rate of resistance change ($\Delta R/R$) was almost constant.

Figure 10:
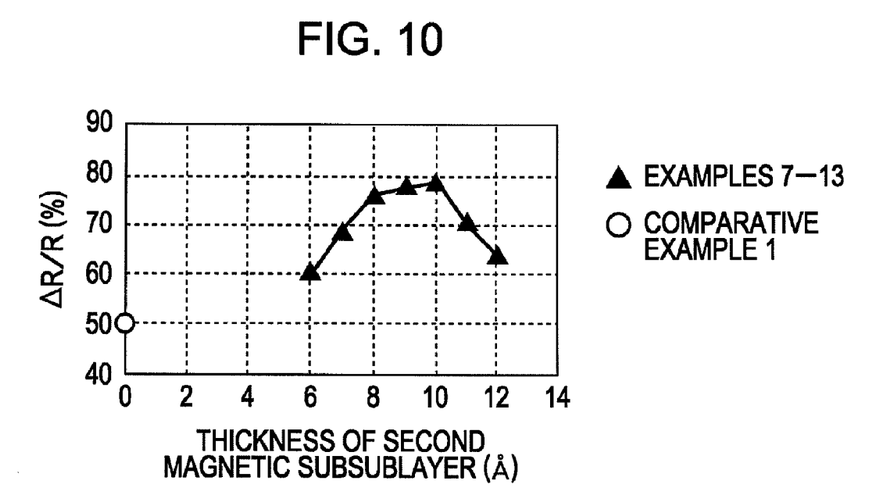
FIG. 10 is a graph illustrating the relationship between the thickness of a second magnetic subsublayer and the rate of resistance change ($\Delta R/R$) in tunnel magnetoresistive sensors including a second pinned magnetic sublayer having a two-layered structure composed of a first magnetic subsublayer and the second magnetic subsublayer.

FIG. 10 shows the rate of resistance change ($\Delta R/R$) in Examples 7 to 13, in which the thickness (t2) of the second magnetic subsublayer 4c2 was in the range of 6 to 12 angstroms, and Comparative Example 1, in which the second pinned magnetic sublayer 4c was formed of a CoFeB monolayer (that is, the thickness of the second magnetic subsublayer 4c2 was zero angstroms).

FIG. 10 shows that Examples 7 to 13, in which the thickness of the second magnetic subsublayer 4c2 was in the range of 6 to 12 angstroms, had a higher rate of resistance change ($\Delta R/R$) than Comparative Example 1, in which the thickness of the second magnetic subsublayer 4c2 was zero angstroms. Furthermore, it was found that when the thickness of the second magnetic subsublayer 4c2 was in the range of 7 to 11 angstroms, in particular in the range of 8 to 10 angstroms, a much higher rate of resistance change ($\Delta R/R$) was achieved.

Figure 11:
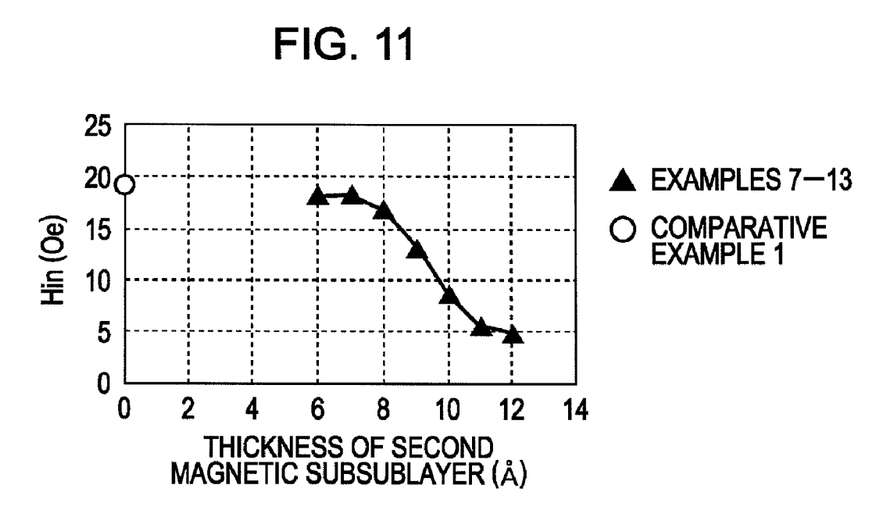
FIG. 11 is a graph illustrating the relationship between the thickness of a second magnetic subsublayer and the interlayer coupling magnetic field (Hin) in tunnel magnetoresistive sensors including a second pinned magnetic sublayer having a two-layered structure composed of a first magnetic subsublayer and the second magnetic subsublayer.

FIG. 11 shows the interlayer coupling magnetic field (Hin) between the free magnetic layer 6 and the pinned magnetic layer 4 in Examples 7 to 13 and Comparative Example 1.

FIG. 11 shows that when the thickness of the second magnetic subsublayer 4c2 was in the range of 6 to 12 angstroms, the interlayer coupling magnetic field Hin could be larger than that of Comparative Example 1. Thus, it is believed that the flatness of an interface between the pinned magnetic layer and the insulating barrier layer was improved in the present examples relative to Comparative Example 1. Furthermore, as shown in FIG. 11, in the examples, the interlayer coupling magnetic field Hin was found to decrease with increasing average thickness of the second magnetic subsublayer (CoFe layer). Thus, when the average thickness of the second magnetic subsublayer 4c2 is in the range of 6 to 12 angstroms, a larger average thickness within this range will be preferred.

These experimental results show that the layered structure of the second pinned magnetic sublayer 4c composed of the first magnetic subsublayer 4c 1 and the second magnetic subsublayer 4c2 can achieve a high rate of resistance change ($\Delta R/R$).

What is claimed is:

1. A tunnel magnetoresistive sensor, comprising
   a pinned magnetic layer having fixed magnetization, an insulating barrier layer, and a free magnetic layer having variable magnetization according to an external magnetic field laminated in that order from the bottom, or wherein the free magnetic layer, the insulating barrier layer, and the pinned magnetic layer are laminated in that order from the bottom,
   the insulating barrier layer being formed of Mg—O, and
   a barrier-layer-side magnetic sublayer constituting at least part of the pinned magnetic layer and being in contact with the insulating barrier layer including a first magnetic region formed of CoFeB or FeB and a second magnetic region formed of CoFe or Fe, the second magnetic region being disposed between the first magnetic region and the insulating barrier layer and the first magnetic region and the second magnetic region being in direct contact.

2. A tunnel magnetoresistive sensor, comprising
   a pinned magnetic layer having fixed magnetization, an insulating barrier layer, and a free magnetic layer having variable magnetization according to an external magnetic field laminated in that order from the bottom, or wherein the free magnetic layer, the insulating barrier layer, and the pinned magnetic layer are laminated in that order from the bottom,
   the insulating barrier layer being formed of Mg—O, and
   a barrier-layer-side magnetic sublayer constituting at least part of the pinned magnetic layer and being in contact with the insulating barrier layer including a first magnetic region formed of CoFeB or FeB and a second magnetic region formed of CoFe or Fe, the second magnetic region being disposed between the first magnetic region and the insulating barrier layer;

wherein the first magnetic region includes a composition modulation region in which the concentration of B decreases gradually from a first boundary of the first magnetic region toward the second magnetic region, the first boundary being opposite a second boundary between the first magnetic region and the second magnetic region.

3. The tunnel magnetoresistive sensor according to claim 1, wherein the barrier-layer-side magnetic sublayer is formed by element diffusion at an interface between a first magnetic subsublayer formed of CoFeB or FeB and a second magnetic subsublayer formed of CoFe or Fe, the second magnetic subsublayer being disposed between the first magnetic subsublayer and the insulating barrier layer, in a layered structure including the first magnetic subsublayer and the second magnetic subsublayer.

4. A tunnel magnetoresistive sensor, comprising
a pinned magnetic layer having fixed magnetization, an insulating barrier layer, and a free magnetic layer having variable magnetization according to an external magnetic field laminated in that order from the bottom, or wherein the free magnetic layer, the insulating barrier layer, and the pinned magnetic layer are laminated in that order from the bottom,
the insulating barrier layer being formed of Mg—O, and
a barrier-layer-side magnetic sublayer constituting at least part of the pinned magnetic layer and being in contact with the insulating barrier layer and has a layered structure including a first magnetic subsublayer formed of CoFeB or FeB and a second magnetic subsublayer formed of CoFe or Fe, the second magnetic subsublayer being disposed between the first magnetic subsublayer and the insulating barrier layer and the first magnetic subsublayer and the second magnetic subsublayer being in direct contact.

5. The tunnel magnetoresistive sensor according to claim 3, wherein the first magnetic subsublayer is formed of $(Co_xFe_{100-x})_{100-y}B_y$, wherein the composition ratio Y of B is in the range of about 15 to about 30 atomic percent.

6. The tunnel magnetoresistive sensor according to claim 3, wherein the average thickness of the first magnetic subsublayer is in the range of about 10 to about 30 angstroms.

7. The tunnel magnetoresistive sensor according to claim 3, wherein the second magnetic subsublayer is formed of $Co_zFe_{100-z}$, wherein the composition ratio Z of Co is in the range of about 0 to about 80 atomic percent.

8. The tunnel magnetoresistive sensor according to claim 4, wherein the average thickness of the second magnetic subsublayer is in the range of about 6 to about 12 angstroms.

9. The tunnel magnetoresistive sensor according to claim 1, wherein the barrier-layer-side magnetic sublayer, the insulating barrier layer, and at least a portion of the free magnetic layer in contact with the insulating barrier layer have equivalent crystal faces of a body-centered cubic structure represented by a {100} plane preferentially oriented parallel to the layers.

10. The tunnel magnetoresistive sensor according to claim 1, wherein the pinned magnetic layer has a layered ferri structure including a first pinned magnetic sublayer, a nonmagnetic intermediate sublayer, and a second pinned magnetic sublayer laminated in this order, the second pinned magnetic sublayer being the barrier-layer-side magnetic sublayer in contact with the insulating barrier layer.

11. The tunnel magnetoresistive sensor according to claim 1, wherein the free magnetic layer includes an enhance sublayer and a soft magnetic sublayer disposed on the enhance sublayer, the enhance sublayer being in contact with the insulating barrier layer and being formed of CoFe, the soft magnetic sublayer being formed of a NiFe alloy.

12. A method for manufacturing a tunnel magnetoresistive sensor including a layered portion, the layered portion including a pinned magnetic layer having a fixed magnetization direction, an insulating barrier layer, and a free magnetic layer having a variable magnetization direction according to an external magnetic field laminated in that order from the bottom, the method comprising the steps of:
(a) stacking a second magnetic subsublayer formed of CoFe or Fe on a first magnetic subsublayer formed of CoFeB or FeB to form a barrier-layer-side magnetic sublayer constituting at least part of the pinned magnetic layer wherein the first magnetic subsublayer and the second magnetic subsublayer are in direct contact;
(b) forming an insulating barrier layer formed of Mg—O on the barrier-layer-side magnetic sublayer; and
(c) forming the free magnetic layer on the insulating barrier layer.

13. A method for manufacturing a tunnel magnetoresistive sensor including a layered portion, the layered portion including a free magnetic layer having a variable magnetization direction according to an external magnetic field, an insulating barrier layer, and a pinned magnetic layer having a fixed magnetization direction laminated in that order from the bottom, the method comprising the steps of:
(d) forming the free magnetic layer;
(e) forming an insulating barrier layer formed of Mg—O on the free magnetic layer; and
(f) stacking a second magnetic subsublayer formed of CoFe or Fe and a first magnetic subsublayer formed of CoFeB or FeB on the insulating barrier layer to form a barrier-layer-side magnetic sublayer constituting at least part of the pinned magnetic layer wherein the first magnetic subsublayer and the second magnetic subsublayer are in direct contact.

14. The method for manufacturing a tunnel magnetoresistive sensor according to claim 12, wherein, in the formation of the first magnetic subsublayer, the first magnetic subsublayer is formed of $(Co_xFe_{100-x})_{100-y}B_y$, wherein the composition ratio Y of B is controlled within the range of about 15 to about 30 atomic percent.

15. The method for manufacturing a tunnel magnetoresistive sensor according to claim 12, wherein the first magnetic subsublayer has an average thickness in the range of about 10 to about 30 angstroms.

16. The method for manufacturing a tunnel magnetoresistive sensor according to claim 12, wherein, in the formation of the second magnetic subsublayer, the second magnetic subsublayer is formed of $Co_zFe_{100-z}$, wherein the composition ratio Z of Co is controlled within the range of about 0 to about 80 atomic percent.

17. The method for manufacturing a tunnel magnetoresistive sensor according to claim 12, wherein the second magnetic subsublayer has an average thickness in the range of about 6 to about 12 angstroms.

18. The method for manufacturing a tunnel magnetoresistive sensor according to claim 12, wherein, in the formation of the insulating barrier layer, a Mg layer is formed and is then oxidized to form the insulating barrier layer formed of Mg—O.

19. The method for manufacturing a tunnel magnetoresistive sensor according to claim 12, wherein, in the formation of the insulating barrier layer, the insulating barrier layer formed of Mg—O is formed using a Mg—O target.

20. The method for manufacturing a tunnel magnetoresistive sensor according to claim 12, wherein annealing is performed after the formation of the layered portion.

* * * * *